(12) United States Patent
Barrow et al.

(10) Patent No.: US 6,794,917 B1
(45) Date of Patent: Sep. 21, 2004

(54) SYSTEM AND METHOD FOR GENERATING MINIMUM ON-TIME PULSES

(75) Inventors: Steven Michael Barrow, Gilbert, AZ (US); Robert Kenneth Oppen, Chandler, AZ (US); Steven Harris, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/620,100

(22) Filed: Jul. 14, 2003

(51) Int. Cl.[7] .................................................. H03K 3/10
(52) U.S. Cl. ...................................... 327/227; 323/282
(58) Field of Search ............................... 327/185, 227, 327/229; 323/282, 283, 285, 224, 266, 271

(56) References Cited

U.S. PATENT DOCUMENTS

| | | | |
|---|---|---|---|
| 6,396,252 B1 | 5/2002 | Culpepper et al. | 323/285 |
| 6,420,858 B1 | 7/2002 | Kitagawa et al. | 323/282 |
| 6,452,368 B1 * | 9/2002 | Basso et al. | 323/282 |
| 6,661,208 B2 * | 12/2003 | Rutter et al. | 323/224 |

OTHER PUBLICATIONS

"LM2645 Advanced Two–Phase Switching Controller with Two Linear Outputs," *National Semiconductor Corporation*, Apr. 2001, 1 page.

* cited by examiner

*Primary Examiner*—Linh M. Nguyen
(74) *Attorney, Agent, or Firm*—Brett A. Hertzberg; Merchant & Gould P.C.

(57) ABSTRACT

The on-time of a pulse signal is controlled by comparing a ramp signal to an input signal that is dynamically selected from two signals. A first operating mode is active when a clock signal is in a first logic state, where the pulse signal is reset. A second operating mode is initiated when the clock signal changes from the first logic state to a second logic state. During the second operating mode, the ramp signal is compared to the first signal. A third operating mode is initiated when the ramp signal exceeds the first signal during the second operating mode. During the third operating mode, the pulse signal is set and the ramp signal is compared to the second signal. The pulse signal is reset when the when the ramp signal exceeds the second signal in the third operating mode such that the on-time of the pulse signal is controlled.

20 Claims, 4 Drawing Sheets

SYSTEM AND METHOD FOR GENERATING MINIMUM ON-TIME PULSES

FIELD OF THE INVENTION

The present invention is related to pulse generation. More particularly, the present invention is related to a system and method for generating a pulse using a single comparator and supporting logic. Delays for activating the pulse are matched by delays for deactivating the pulse such that the pulse width is carefully controlled.

BACKGROUND OF THE INVENTION

DC-DC converters are switching regulators that typically employ pulse-width modulation (PWM) control. The converter is arranged to control the on-time of a switching element. The output of the switching element is a pulsed input voltage (VIN) that is coupled to a filter network such as an L-C filter. The L-C filter stores energy from the voltage pulse to provide an average output voltage (VOUT). The average output voltage is related to the pulsed input voltage (VIN) by the pulse on-time (TON) and the period of the pulse (TP) as given by: VOUT=VIN*TON/TP. By varying the on-time (TON) of the pulsed input voltage (VIN), the average output voltage (VOUT) can be adjusted.

During the on-time, the switching element is activated such that input voltage (VIN) is connected to the inductor (L). The difference between the input voltage (VIN) and the output voltage (VOUT) is forced across the inductor, causing the current flow through the inductor to increase. During the on-time, current is delivered to the capacitor (C) and the load through the inductor. The output voltage (VOUT) increases as current is delivered to the capacitor (C).

During the off-time, voltage applied to the inductor is removed. Since current in an inductor cannot change instantaneously, the voltage across the inductor will adjust to hold the current constant. A freewheeling diode is typically connected in parallel with the L-C filter circuit. The input end of the inductor is forced negative in voltage by the decreasing current, eventually reaching the point where the diode is turned on. The inductor current then flows through the load and back through the diode. The capacitor discharges into the load during the off time, contributing to the total current being supplied to the load. The total load current during the switch off-time corresponds to the sum of the inductor and capacitor current.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
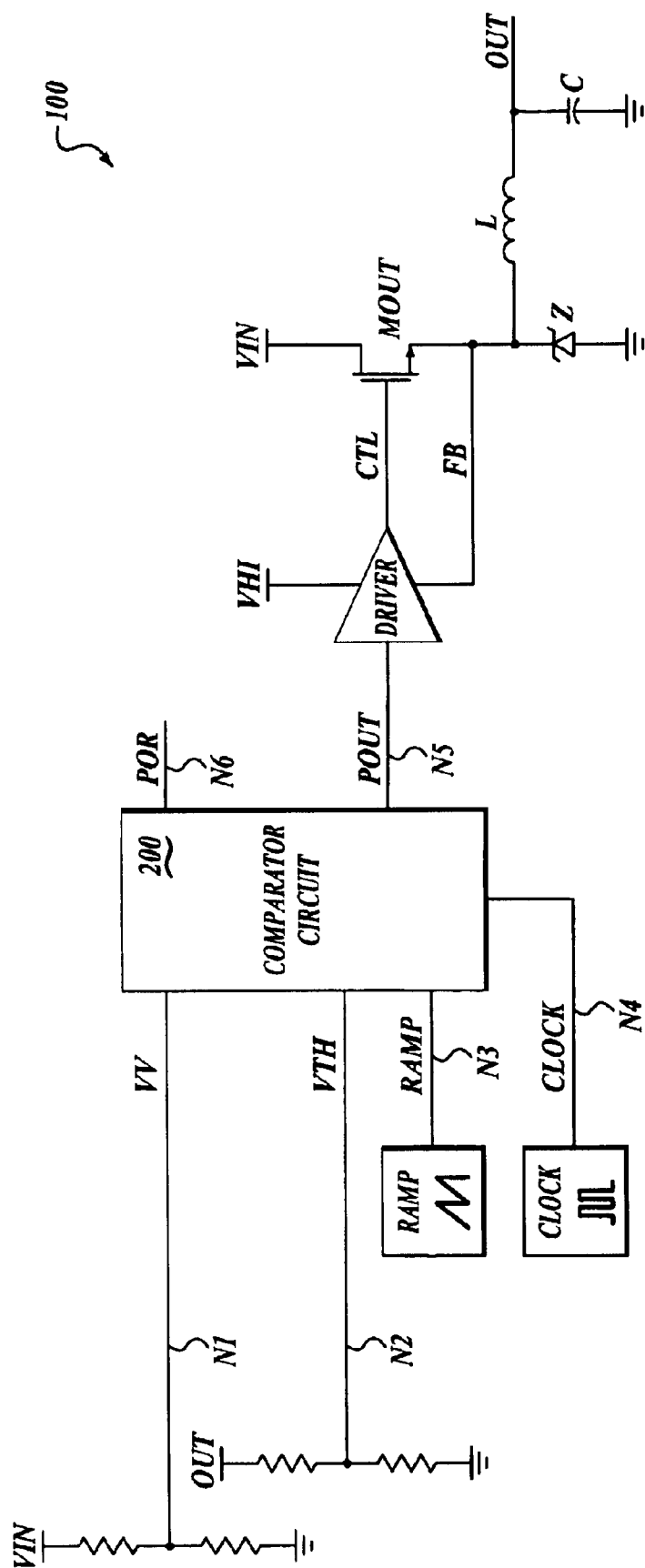
FIG. 1 is a schematic illustration of an example operating environment for an embodiment of the present invention.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meaning of "a," "an," and "the" includes plural reference. The meaning of "in" includes "in" and "on." The term "connected" means a direct connection between the items connected, without any intermediate devices. The term "coupled" refers to both direct connections between the items connected, and indirect connections through one or more intermediary items. The term "circuit" may refer to both single components, and to a multiplicity of components. The term component refers to one or more items that are configured to provide a desired function. The term "signal" includes signals such as currents, voltages, charges, logic signals, data signals, optical signals, electromagnetic waves, as well as others.

Briefly stated, the present invention is related to an apparatus, system and method for controlling the on-time of a pulse signal in an electronic system. The on-time of a pulse signal is controlled by comparing a ramp signal to an input signal that is dynamically selected from two signals. A first operating mode is active when a clock signal is in a first logic state, where the pulse signal is reset. A second operating mode is initiated when the clock signal changes from the first logic state to a second logic state. During the second operating mode, the ramp signal is compared to the first signal. A third operating mode is initiated when the ramp signal exceeds the first signal during the second operating mode. During the third operating mode, the pulse signal is set and the ramp signal is compared to the second signal. The pulse signal is reset when the when the ramp signal exceeds the second signal in the third operating mode such that the on-time of the pulse signal is controlled.

Example Operating Environment

FIG. 1 is a schematic illustration (100) of an example operating environment for an embodiment of the present invention. The example illustrated in FIG. 1 includes two voltage references, a ramp generator, a clock generator, a comparator circuit, a driver circuit, an output driver, a zener diode, an inductor, and a capacitor.

A first signal (VV) is provided to node NI by the voltage reference such as a voltage divider that is coupled to the input power supply (VIN). A second signal (VTH) is provided to node N2 by the second voltage reference such as a voltage divider that is coupled to the output (OUT). A ramp signal (RAMP) is provided to node N3 by the ramp generator, while a clock signal (CLOCK) is provided to node N4 by the clock generator circuit. The comparator circuit (200) is configured to receive signals VTH, VV, RAMP, CLOCK, and a power-on-reset (POR) signal. Comparator circuit 200 is arranged to provide a pulse output signal (POUT) at node N5. The driver circuit is configured to control a driver (e.g., transistor MOUT) via a control signal (CTL) such that power is coupled from the input power supply (VIN) to the output (OUT). When the driver is an N-type field effect transistor (e.g., MOUT), the driver circuit is powered by a separate supply (e.g., VHI) such that the gate of the transistor is driven above the level of the input power supply (VIN). The inductor (L) charges while the driver is active such that the capacitor (C) stores charge for the output (OUT). The zener diode (Z) is arranged to provide a conduction path for the inductor (L) while the driver circuit is inactive.

The example schematic illustrated in FIG. 1 is a switching-type converter such as a DC-DC converter. The on-time of the output pulse (POUT) is arranged to control the amount of energy that is stored in the inductor (L) in the DC-DC converter. It is understood and appreciated that the comparator circuit (200) may be arranged for applications other than DC-DC converters.

Example Comparator Circuit

Figure 2:
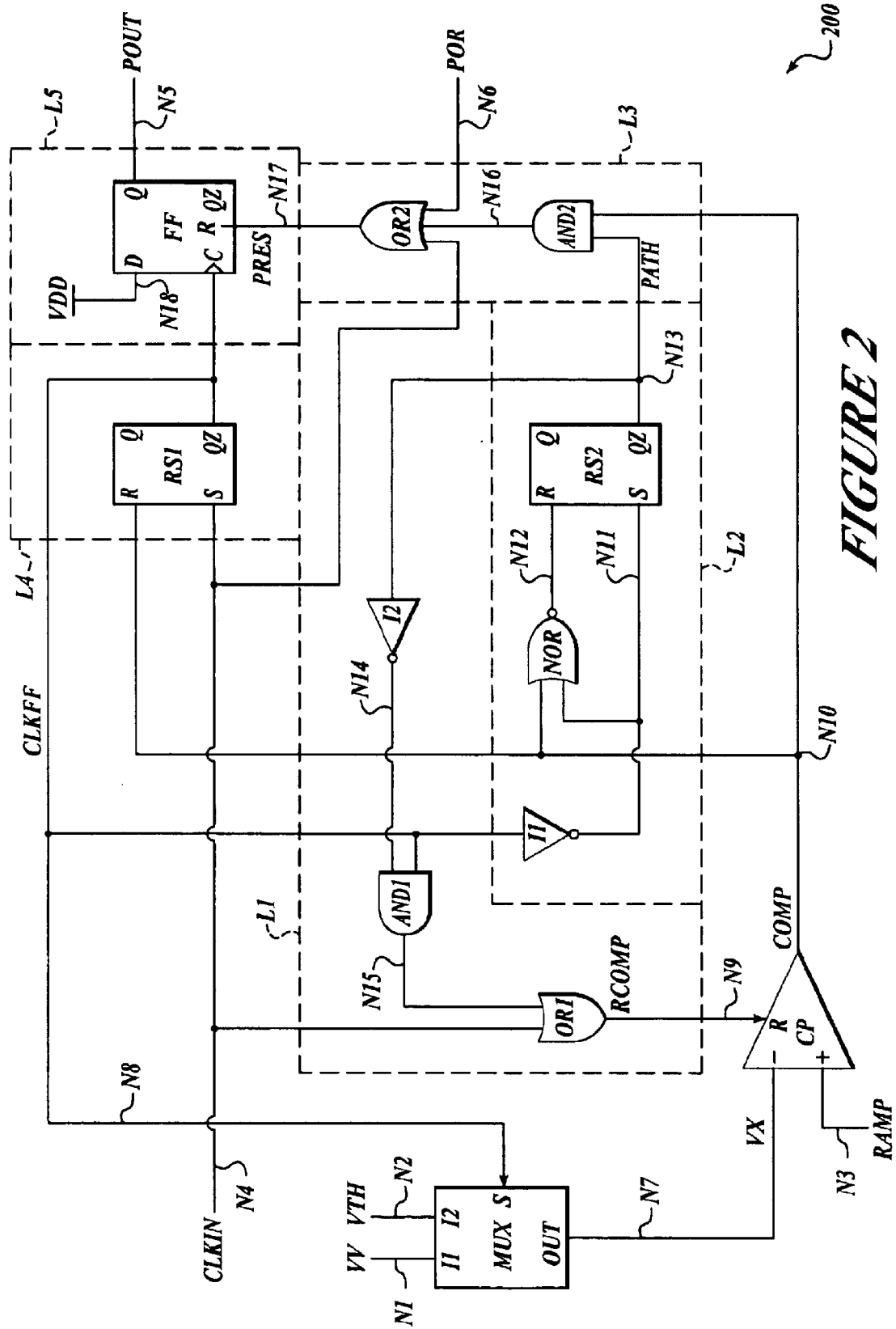
FIG. 2 is a schematic illustration of an example embodiment of the present invention.

FIG. 2 is a schematic illustration of an example embodiment of the present invention. The example illustrated in FIG. 2 includes a comparator (CP), a multiplexer (MUX), and five logic circuits (L1–L5) that are arranged to operate as a comparator circuit (200). A power-on-reset (POR) signal is illustrated, and may be employed to disable the pulse output (POUT) during a power-up sequence where various signals may be in an undetermined state, or various circuits have insufficient power for predictable operation.

The multiplexer (MUX) is arranged to selectively couple one of two signals (VV, VTH) to node N7 in response to a selector control signal (e.g., CLKFF). The selected signal at node N7 corresponds to signal VX. In one example, signal VV is coupled from node N1 to node N7 when the selector control signal is in a first logic state, while signal VTH is coupled from node N2 to node N7 when the selector control signal is in a second logic state.

The comparator (CP) is arranged to receive signals VX, RAMP, and RCOMP from nodes N7, N3, and N9, respectively. Comparator CP is arranged to selectively provide a comparison signal (COMP) at node N10 in response to the received signals. Signal RCOMP is configured to operate as a reset signal that resets the output of the comparator circuit when asserted. Comparator CP selectively asserts the comparison signal (COMP) in response to signals VX and RAMP when signal RCOMP is de-asserted. Signal RAMP corresponds to a ramp signal such as the ramp signal that is illustrated in FIG. 1.

Logic circuits L1–L5 are arranged to control the various operating modes in the comparator circuit (200). Logic circuit L1 is arranged to selectively assert the reset comparator signal (RCOMP) for comparator CP. Logic circuit L1 is responsive to a clock signal (CLKIN) at node N4, the selector control signal at node N8, and an enable reset path signal (PATH) at node N13. Logic circuit L2 is arranged to selectively disable a reset path in logic circuit L3 via the enable reset path signal (PATH). Logic circuit L3 is responsive to the selector control signal (e.g., CLKFF) and the comparison signal (COMP). Logic circuit L3 is arranged to selectively provide a pulse reset signal (PRES) at node N17 in response to the comparison signal (COMP), the clock signal (CLKIN), a power-on-reset signal (POR), and the enable reset path signal (PATH). Logic circuit L4 is arranged to provide the selector control signal in response to the clock signal (CLKIN) and the comparison signal (COMP). Logic circuit L5 is arranged to selectively activate the pulse signal (POUT) in response to the selector control signal and the pulse reset signal (PRES).

In one example embodiment, logic circuit L1 includes an OR logic gate (OR1), an AND logic gate (AND1), and an inverter (I2). In another example embodiment, logic circuit L2 includes an inverter (I1), a NOR logic gate (NOR), and an RS-type latch (RS2). In still another example embodiment, logic circuit L3 includes an AND logic gate (AND2), and an OR logic gate (OR2). In yet another example embodiment, logic circuit L4 includes an RS-type latch (RS1). In still yet another example embodiment, logic circuit L5 includes a D-type flip-flop circuit (FF). The functions provided by logic circuits L1–L5 may be combined into one or more circuits that provide similar functionality without departing from the scope of the present invention. For example, latches and flip-flops are merely one example of circuits that can be utilized to detect edge transitions and provide memory-type functions that are necessary to maintain the comparator circuit (200) in various operating states.

Figure 3:
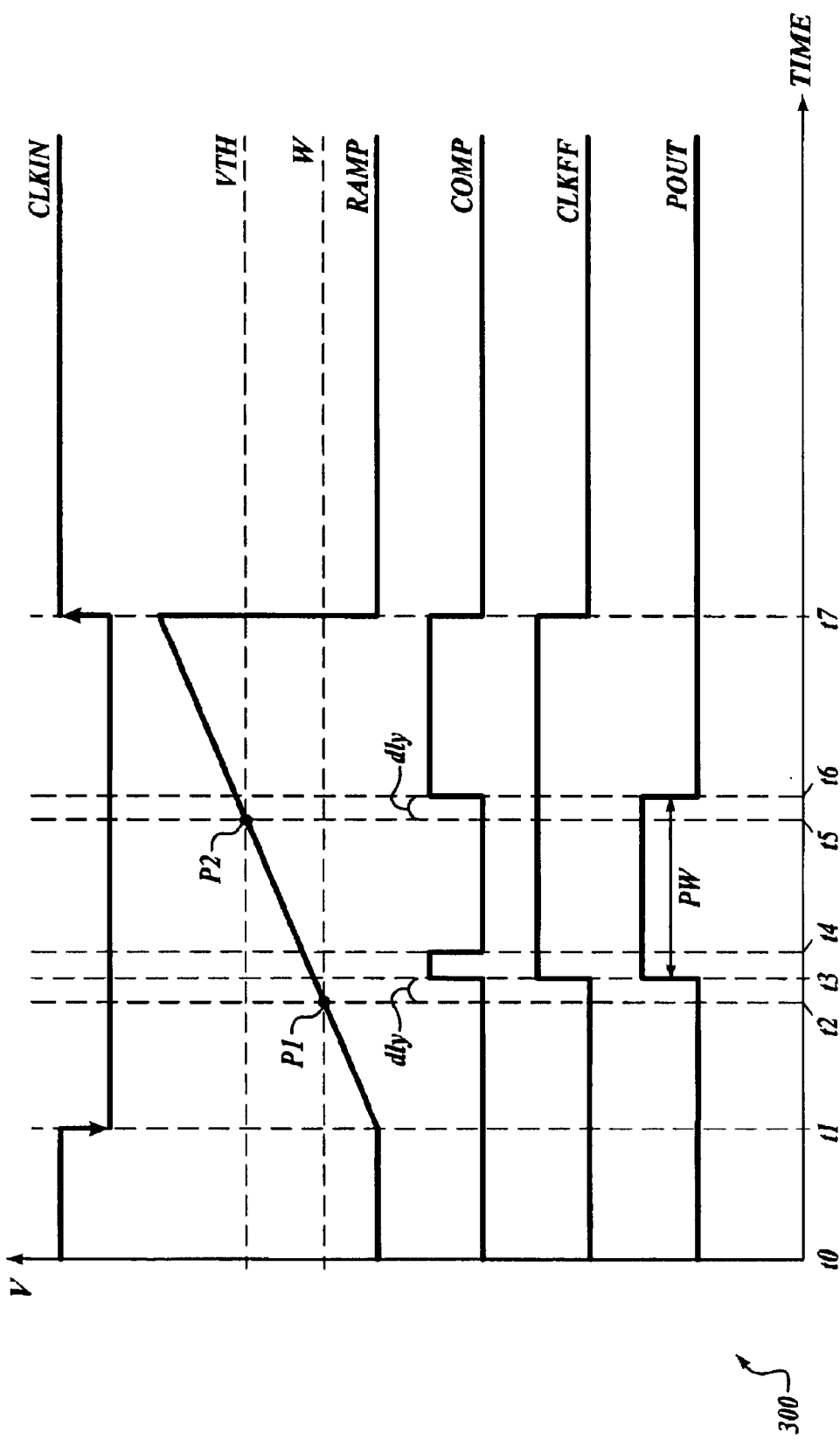
FIG. 3 is a graphical illustration of transient signals for an example embodiment of the present invention.

The various operating states of the comparator circuit (200) will be described with reference to the waveforms that are illustrated in FIG. 3.

Example Signal Waveforms

FIG. 3 is a graphical illustration of transient signals for an example embodiment of the present invention. The example waveforms illustrated in FIG. 3 will be described with reference to the example embodiment that is illustrated in FIG. 2.

From time t0 to t1 the system is in a first operating mode, where the clock signal (CLKIN) is in a "logic 1" state. During the first operating mode: comparator CP is reset in response to the clock signal (CLKIN) via the reset comparator signal (RCOMP); the pulse output (POUT) is reset (e.g., POUT is set to a logical zero) in response to the clock signal (CLKIN) via the pulse reset signal (PRES); and the selector control signal (CLKFF) selects VX=VV.

At time t1, the clock signal (CLKIN) transitions to a "logic 0" state and the ramp signal (RAMP) begins to change. From time t1 to t2 the system is in a second operating mode, where the clock signal (CLKIN) is in a "logic 0" state, the ramp signal (RAMP) is less than signal VX, and signal VX corresponds to signal VV. Comparator CP is enabled by de-asserting the reset comparator signal (RCOMP), and the pulse reset signal (PRES) is de-asserted, both in response to the clock signal (CLKIN).

At time t2, the ramp signal (RAMP) reaches the selected signal (VX) as illustrated by point P1. Comparison signal COMP will ideally be asserted at time t2. Logic circuit L4 is arranged to change the selector control signal (CLKFF) when the comparison signal (COMP) is asserted such that the selected signal (VX) changes to VTH. The comparison signal (COMP) is de-asserted when VX=VTH since the ramp signal (RAMP) is less than selected signal VTH. The transition in the selector control signal (CLKFF) also triggers the activation of the pulse output (POUT). The initiation of the pulse output (POUT) signals the start of the third operating mode, which approximately spans from time t2 through time t5. In the third operating mode: comparator CP is enabled, the selected signal (VX) corresponds to signal VTH, and the reset path is enabled via signal PATH.

At time t5, the ramp signal (RAMP) reaches the selected signal (VX) as illustrated by point P2. Comparison signal COMP will ideally be asserted at time t5. Since the reset path is enabled via signal PATH, the assertion of the comparison signal (COMP) will result in asserting the pulse reset signal (PRES). The pulse output (POUT) is reset (e.g., the Q output of logic circuit L5 is set to a logical zero) in response to the pulse reset signal (PRES). Ramp signal RAMP may continue until the next transition in the clock signal (CLK) as illustrated from time t5 through t7.

Comparator CP may have various input referred offsets, or minimum overdrive characteristics that result in a delay (dly) from the crossing of point P1 and the assertion of the comparison signal (COMP) at time t3. Since one comparator is used to accomplish the detection of crossing point P1 and the crossing of point P2, a matched delay characteristic (dly) will be observed between times t2–t3 and times t5–t6. Since the delay characteristics (dly) in the system are matched, the overall pulse-width (PW) of the pulse output (POUT) should be maintained close to an ideal pulse width with reduced error characteristics when compared to an implementation with two comparators.

Example Process Flow

Figure 4:
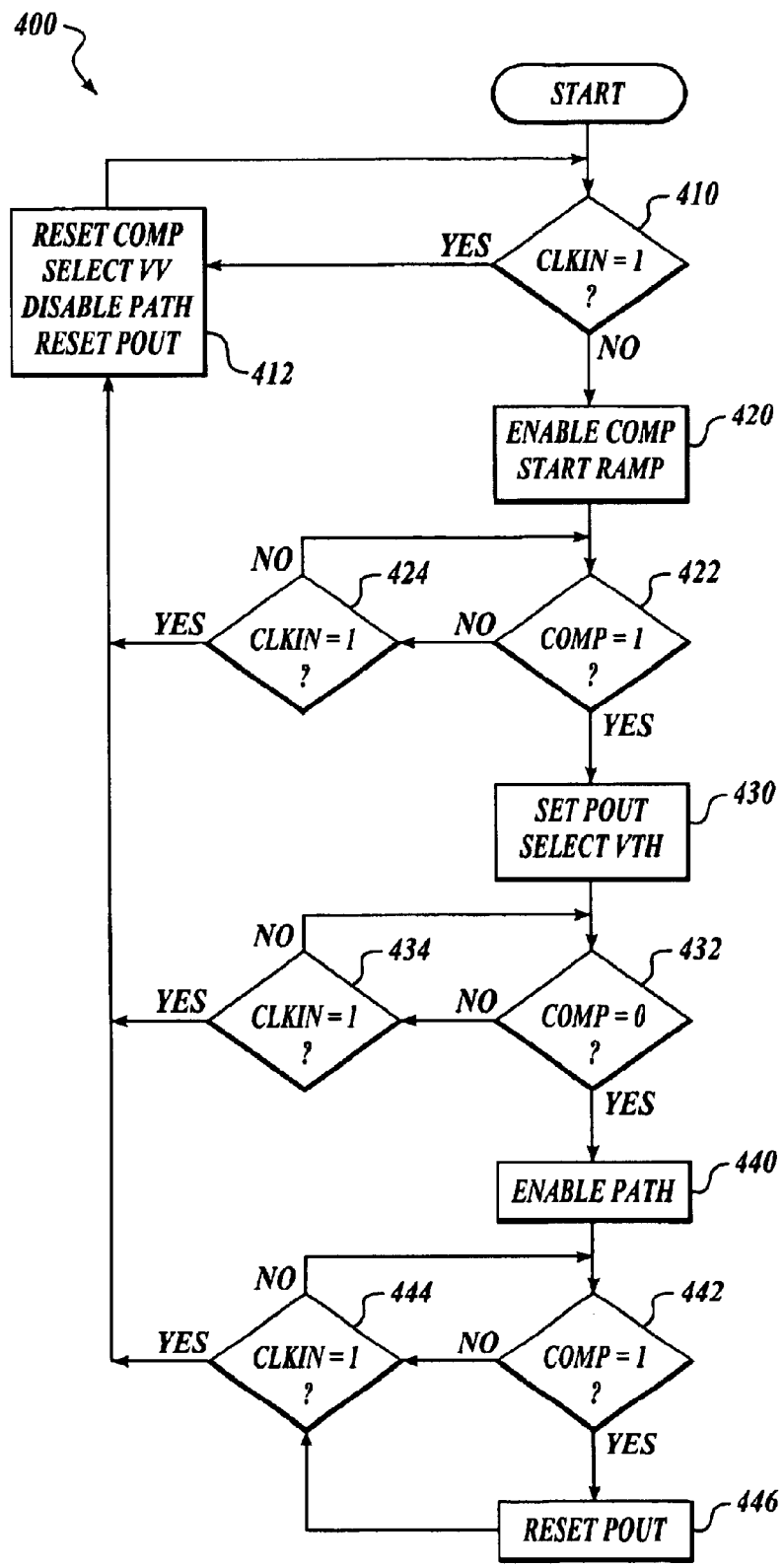
FIG. 4 is a graphical illustration of a procedural flow for an example embodiment of the present invention.

FIG. 4 is a graphical illustration of a procedural flow for an example embodiment of the present invention.

Processing begins at decision block 410 where the clock signal (CLKIN) is evaluated. Processing continues from decision block 410 to block 412 when the clock signal (CLKIN) is in the first logic state (e.g., logic "1"). At block 412, the comparator is reset, the selected signal corresponds to signal VV, the reset path is disabled, and the pulse output (POUT) is reset. Processing alternatively flows from decision block 410 to block 420 when the clock signal (CLKIN) is in the second logic state (e.g., logic "0").

At block 420, the comparator is enabled by de-asserting the comparator reset signal (e.g., RCOMP), and the ramp signal (RAMP) is initiated. Processing continues from block 420 to decision block 422, where the comparison signal (COMP) is evaluated. Processing flows from decision block 422 to decision block 424 when the comparison signal is not asserted (e.g., logic "0"). Alternatively, processing flows from decision block 422 to block 430 when the comparison signal is asserted (e.g., logic "1"). At decision block 424, the clock signal is again evaluated. Processing continues from decision block 422 to decision block 422 when the clock signal (CLKIN) is in the second logic state (e.g., logic "0"). Alternatively processing flows from decision block 424 to block 412 when the clock signal (CLKIN) corresponds to the first logic state (e.g., logic "1").

At block 430, the comparator pulse output (POUT) is set (e.g., logic "1"), and the selected signal (VX) is selected as signal VTH. Since VTH is greater than VV, the comparison signal (COMP) should be de-asserted (e.g., logic "0"). Processing continues from block 430 to decision block 432, where the comparison signal (COMP) is evaluated. Processing flows from decision block 432 to decision block 434 when the comparison signal is asserted (e.g., logic "1"). Alternatively, processing flows from decision block 432 to block 440 when the comparison signal is de-asserted (e.g., logic "0"). At decision block 434, the clock signal (CLKIN) is again evaluated. Processing continues from decision block 434 to decision block 432 when the clock signal (CLKIN) is in the second logic state (e.g., logic "0"). Alternatively, processing flows from decision block 434 to block 412 when the clock signal (CLKIN) corresponds to the first logic state (e.g., logic "1").

At block 440, the pulse reset path is enabled by asserting PATH. Processing continues from block 440 to decision block 442, where the comparison signal (COMP) is evaluated. Processing flows from decision block 442 to decision block 444 when the comparison signal is not asserted (e.g., logic "0"). Alternatively, processing flows from decision block 442 to block 446 when the comparison signal is asserted (e.g., logic "1"). At decision block 444, the clock signal is again evaluated. Processing continues from decision block 442 to decision block 442 when the clock signal (CLKIN) is in the second logic state (e.g., logic "0"). Alternatively processing flows from decision block 444 to block 412 when the clock signal (CLKIN) corresponds to the first logic state (e.g., logic "1"). At block 446, the pulse output (POUT) is reset.

Although FIG. 4 has been described with reference to the signal names used in FIGS. 2 and 3, the system may be implemented using circuits other than that described in FIG. 2 without departing from the spirit of the present invention.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for generating a pulsed output signal, comprising:

a comparator circuit that is configured to receive a ramp signal, a selected signal, and a comparator reset signal, wherein an output associated with the comparator circuit is maintained in a reset condition when the comparator reset signal is asserted, and wherein the comparator circuit is arranged to selectively assert a comparison signal in response to the selected signal and the ramp signal when the comparator reset signal is de-asserted;

a signal selector circuit that is configured to receive a first signal, a second signal, and a selector control signal, wherein the signal selector circuit is arranged to select the first signal as the selected signal when the selector control signal is de-asserted, and wherein the signal selector circuit is arranged to select the second signal as the selected signal when the selector control signal is asserted; and a logic circuit that is configured to receive a clock signal and the comparison signal, wherein the logic circuit is arranged to de-assert the selector control signal when the clock signal is asserted, assert the selector control signal when the clock signal is de-asserted and the comparison signal is asserted, de-assert the pulse output signal when the clock signal is asserted, assert the comparator reset signal when the clock signal is asserted, assert the pulsed output signal while the clock signal is de-asserted and the ramp signal is between the first signal and the second signal.

2. The apparatus of claim 1, wherein the signal selector circuit is a multiplexer that is arranged to selectively couple one of the first and second signals to the comparator circuit in response to the selector control signal.

3. The apparatus of claim 1, the logic circuit comprising: a latch circuit that includes a reset terminal, a set terminal, and an output terminal, wherein the set terminal is coupled to the clock signal, the reset terminal is coupled to the comparison signal, and the output terminal is arranged to provide the selector control signal.

4. The apparatus of claim 1, the logic circuit comprising: a flip-flop circuit that includes a D-input terminal, a clock terminal, a reset terminal, and an output terminal, wherein the D-input terminal is coupled to a power signal, the clock terminal is coupled to the selector control signal, the reset terminal is coupled to the clock signal, and the output terminal is arranged to provide the pulsed output signal.

5. The apparatus of claim 1, the logic circuit comprising: a latch circuit, wherein the latch circuit is arranged to assert an enable reset path signal when the comparison signal is de-asserted and the selector control signal is asserted, wherein the latch circuit is arranged to de-assert the enable reset path signal when the selector control signal is de-asserted, wherein the comparator reset signal is asserted when the enable reset path signal is de-asserted and the selector control signal is asserted, and wherein the pulsed output signal is de-asserted when the enable reset path signal is asserted and the comparison signal is asserted.

6. The apparatus of claim 1, the logic circuit further comprising: a first logic circuit and a second logic circuit, wherein the first logic circuit is arranged to assert the reset comparator signal in response to the clock signal, wherein the first logic circuit is also arranged to assert the reset comparator signal when the enable reset path signal is asserted and the selector control signal is asserted, wherein the second logic circuit is arranged to assert the enable reset path signal when the comparison signal is de-asserted and the selector control signal is asserted, wherein the second logic circuit is arranged to de-assert the enable reset path signal when the selector control signal is de-asserted.

7. The apparatus of claim 6, the logic circuit further comprising: a third logic circuit, wherein the third logic circuit is arranged to de-assert the pulsed output signal when the enable reset path signal is asserted and the comparison signal is asserted, and wherein the third logic circuit is also arranged to de-assert the pulsed output signal when the clock signal is asserted.

8. The apparatus of claim 7, the logic circuit further comprising: a fourth logic circuit and a fifth logic circuit, wherein the fourth logic circuit is arranged to assert the selector control signal when the comparison signal is asserted, and de-assert the selector control signal when the clock signal is asserted, and wherein the fifth logic circuit is arranged to assert the pulsed output signal when the selector control signal transitions from de-asserted to asserted.

9. A method for providing a pulsed output signal, comprising:
  selecting a first operating mode while a clock signal is asserted;
  de-asserting the pulsed output signal during the first operating mode;
  selecting a second operating mode when the clock signal is de-asserted during the first operating mode;
  comparing a ramp signal to a first signal during the second operating mode;
  selecting a third operating mode when the ramp signal exceeds the first signal during the second operating mode;
  comparing the ramp signal to a second signal during the third operating mode, wherein the second signal is different from the first signal; and
  asserting the pulsed output signal during the third operating mode while the second signal is greater than the ramp signal.

10. The method of claim 9, wherein selecting a first operating mode includes: resetting a comparator circuit, and coupling the first signal to the comparator circuit.

11. The method of claim 9, wherein selecting a second operating mode includes: enabling a comparator circuit, and starting the ramp signal.

12. The method of claim 9, wherein selecting a third operating mode includes: coupling the second signal to the comparator circuit.

13. The method of claim 9, further comprising: disabling a reset path when the first operating mode is selected, enabling the reset path when the third operating mode is selected, wherein pulsed output signal is set as asserted when the ramp signal exceeds the first signal in the second operating mode, and wherein the pulsed output signal is reset when the reset path is enabled and the ramp signal exceeds the second signal in the third operating mode.

14. The method of claim 9, wherein the pulsed output signal is asserted in the second operating mode when the ramp signal exceeds the first signal by an amount, wherein the pulsed output signal is de-asserted in the third operating mode when the ramp signal exceeds the second signal by the amount, wherein the amount is associated with a systematic error in the comparison, and wherein the pulse width is relatively unaffected by the systematic error.

15. An apparatus for providing a pulsed output signal, comprising:
  a means for comparing, wherein the means for comparing is arranged to compare a selected signal to a ramp signal to provide a comparison signal;
  a means for activating an operating mode, wherein a first operating mode is activated when a clock signal is asserted, a second operating mode is activated when the clock signal is de-asserted during the first operating mode, and a third operating mode is activated when the comparison signal is asserted during the second operating mode;
  a means for selecting, wherein the means for selecting is arranged to select a first signal when the first operating mode is activated, and wherein the means for selecting is arranged to select a second signal when the third operating mode is activated, wherein the first signal and the second signal are different from one another by an amount that is related to a pulse width;
  a means for setting the pulsed output signal when the third operating mode is activated;
  a first means for resetting, wherein the first means for resetting is arranged to reset the means for comparing when the comparison signal is asserted during the second operating mode;
  a second means for resetting, wherein the second means for resetting is arranged to reset the means for comparing during the first operating mode;
  a third means for resetting, wherein the third means for resetting is arranged to reset the pulsed output signal when the comparison signal is asserted during the third operating mode; and
  a fourth means for resetting, wherein the fourth means for resetting is arranged to reset the pulsed output signal when the first operating mode is activated.

16. An apparatus as in claim 15, further comprising: a means for initiating, wherein the means for initiating is arranged to start the ramp signal when the second operating mode is activated.

17. An apparatus as in claim 15, further comprising: a means for disabling a reset path when the first operating mode is activated, a means for enabling the reset path when the third operating mode is activated, wherein the third means for resetting is disabled when the reset path is disabled.

18. An apparatus as in claim 15, wherein the comparison signal is asserted when the ramp signal exceeds the first signal by a first amount during the second operating mode.

19. An apparatus as in claim 18, wherein the comparison signal is asserted when the ramp signal exceeds the second signal by a second amount during the third operating mode, wherein the first amount and the second amount are approximately the same as one another such that an accurate pulse width is maintained.

20. An apparatus as in claim 15, further comprising a feedback means that is arranged to provide the second signal in response to the pulsed output signal.

* * * * *

UNITED STATES PATENT AND TRADEMARK OFFICE
CERTIFICATE OF CORRECTION

PATENT NO. : 6,794,917 B1  Page 1 of 1
APPLICATION NO. : 10/620100
DATED : September 21, 2004
INVENTOR(S) : Barrow et al.

It is certified that error appears in the above-identified patent and that said Letters Patent is hereby corrected as shown below:

TITLE PAGE, ITEM (57)
Abstract, "when the when the ramp" should read -- when the ramp --

Column 2, line 45, "NI" should read -- N1 --

Column 5, line 15, "dc-asserting" should read -- de-asserting --

Column 6, line 27, "to de-assert" should read -- to: de-assert --

Signed and Sealed this

Twelfth Day of February, 2008

JON W. DUDAS
*Director of the United States Patent and Trademark Office*